(12) United States Patent
Theuss et al.

(10) Patent No.: US 7,781,876 B2
(45) Date of Patent: Aug. 24, 2010

(54) CURING LAYERS OF A SEMICONDUCTOR PRODUCT USING ELECTROMAGNETIC FIELDS

(75) Inventors: Horst Theuss, Wenzenbach (DE); Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 284 days.

(21) Appl. No.: 11/741,324

(22) Filed: Apr. 27, 2007

(65) Prior Publication Data

US 2008/0251904 A1 Oct. 16, 2008

(30) Foreign Application Priority Data

Apr. 13, 2007 (DE) .................. 10 2007 017 641

(51) Int. Cl.
*H01L 23/02* (2006.01)
(52) U.S. Cl. .................. 257/678; 257/687; 257/701; 257/787; 257/788; 257/E23.114; 257/E21.328; 257/E21.347
(58) Field of Classification Search .................. 257/48, 257/678, 698, 737, 687, 701, 787–796, E23.114, 257/E21.328, E21.347
See application file for complete search history.

(56) References Cited

U.S. PATENT DOCUMENTS 4,778,635 A * 10/1988 Hechtman et al. ........... 264/437
5,039,559 A * 8/1991 Sang et al. ............... 427/213.3
5,879,756 A * 3/1999 Fathi et al. .................. 427/487
5,916,641 A 6/1999 McArdle et al.
6,756,689 B2 * 6/2004 Nam et al. .................. 257/783
2004/0026028 A1 2/2004 Kirsten et al.
2004/0232536 A1 * 11/2004 Fukuzumi .................. 257/684
2004/0249037 A1 12/2004 Kolbe
2005/0039848 A1 2/2005 Kirsten
2005/0274454 A1 * 12/2005 Extrand .................. 156/272.4
2006/0033100 A1 * 2/2006 Kokubo et al. ................ 257/48
2006/0278853 A1 12/2006 Yang
2007/0013067 A1 * 1/2007 Nishida et al. .............. 257/737

FOREIGN PATENT DOCUMENTS

| DE | 199 51 599 A1 | 5/2001 |
| DE | 100 37 883 A1 | 2/2002 |
| DE | 102 10 661 | 5/2003 |
| DE | 102 61 406 A1 | 7/2004 |
| DE | 697 34 564 T2 | 8/2006 |
| JP | 2004-288946 A | 10/2004 |
| WO | WO-99/03306 A1 | 1/1999 |

* cited by examiner

*Primary Examiner*—Davienne Monbleau
*Assistant Examiner*—Farid Khan
(74) *Attorney, Agent, or Firm*—Dickstein, Shapiro, LLP.

(57) ABSTRACT

A semiconductor product including a substrate, a semiconductor chip fitted to the substrate, and a layer, which contains coated particles, located adjacent to the semiconductor chip, wherein the coated particles have a ferromagnetic, ferrimagnetic or paramagnetic core and a coating.

17 Claims, 5 Drawing Sheets

US 7,781,876 B2

CURING LAYERS OF A SEMICONDUCTOR PRODUCT USING ELECTROMAGNETIC FIELDS

Embodiments of the invention relate to semiconductor products and semiconductor modules. In particular, they relate to the construction and connection technology of semiconductor products and semiconductor modules and to the layers which are used for this purpose and are composed, for example, of polymers. The invention likewise relates to the production of semiconductor products and semiconductor modules and to the use, included in this case, of layers as, for example, chip adhesive, encapsulation materials, globetop or the like. In particular the invention relates to the semiconductor product and to a method for production of a semiconductor product.

BACKGROUND TO THE INVENTION

During the construction, the processing or the assembly of semiconductor products, polymer compounds are cured in a temperature step. Heating of the semiconductor modules results in solvents in the polymer compounds being liquefied or in molecules being chemically crosslinked in order to cure the polymer materials. The determination of adequate thorough curing, the time optimization of the manufacturing processes, the thermal loads on different module areas of the semiconductor module and the degradation associated with this, for example layer delamination, are only some of the aspects to be considered in this case.

In particular, the influences of the temperature during heating of the entire module in a temperature step and the curing times that are associated with this are restrictive factors for the production of semiconductor modules.

An improvement is therefore desirable for semiconductor modules, for the polymer compounds used for semiconductor modules and for the methods for production of semiconductor modules.

BRIEF DESCRIPTION OF THE FIGURES

Embodiments of the invention will be described in the following text with reference to exemplary embodiments that are illustrated in the attached figures. However, the invention is not restricted to the specifically described embodiments, but can be modified and amended in any suitable manner. It is within the scope of the invention for the individual features and feature combinations of one embodiment to be combined with features and feature combinations of another embodiment.

DETAILED DESCRIPTION OF THE INVENTION

The invention will be explained in the following text with reference to exemplary embodiments.

In order to make it easier to understand the invention, identical reference numbers are used in the following text where these relate to identical elements which are used in the same way in the figures. The intention is for it also to be possible to use elements in one embodiment in a different embodiment without this in each case being mentioned in detail.

Figure 1A:
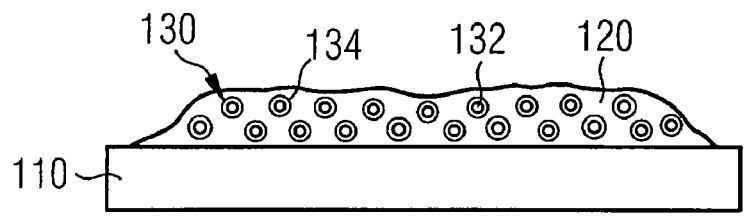
FIG. 1A shows a schematic view of an embodiment of a layer to which particles have been added, on a substrate.

Semiconductor modules are produced using curable or cured layers such as chip adhesive, underfill materials for flipchip bonding or enveloping/encapsulation materials, that is to say encapsulation compounds or molding compounds, which are cured during the course of production. FIGS. 1A to 1D illustrate principles for embodiments of the semiconductor products, and methods for production of semiconductor products and the use of curable or cured layers for semiconductor products, which are described herein. FIG. 1A shows a substrate 110 with a layer 120 applied to it. For simplicity, FIGS. 1A to 1D do not show any semiconductor chip.

Particles 130 are distributed within the layer 120, which may typically be a polymer layer. The particles 130 illustrated in FIGS. 1A and 1B contain a core 132 and a coating 134. The core 132 is composed of a magnetic material, for example a ferromagnetic, ferrimagnetic, paramagnetic or super paramagnetic material. The coating 134 which surrounds the core 132 may, according to various embodiments, be used to match the characteristics of the polymer layer to the requirements of the semiconductor module to be produced.

According to various embodiments, the coating can be designed in such a manner that an electrically conductive or insulating layer is produced, such that an electrically conductive layer with, for example, an additional desired thermal conductivity is produced, such that an insulating layer with, for example, an additionally desired thermal conductivity is produced, such that the thermal coefficient of expansion of the polymer layer is matched to the thermal coefficient of expansion of the adjacent semiconductor module elements, or the like.

Figure 1B:
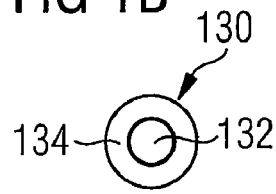
FIG. 1B shows a schematic view of a particle for use in embodiments described herein.
Figure 1C:
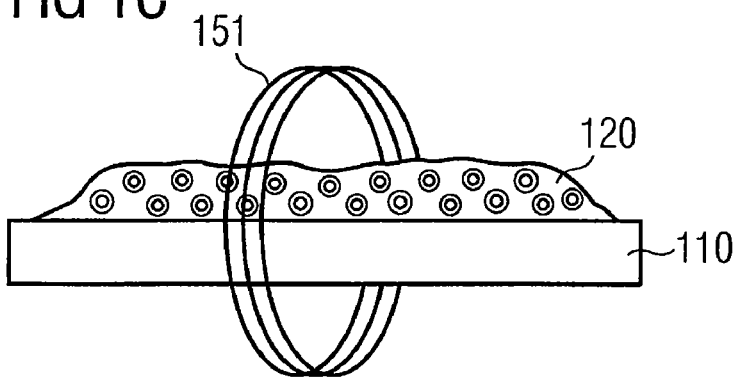
FIG. 1C shows a schematic view of an arrangement for curing of a layer to which particles have been added, according to embodiments described herein.
Figure 1D:
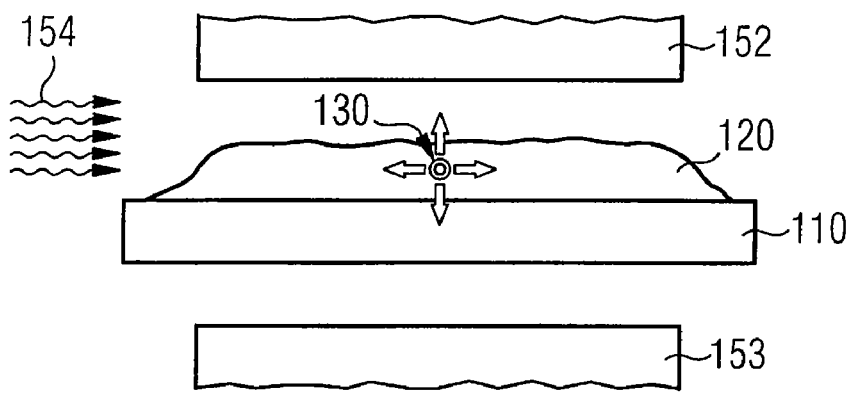
FIG. 1D shows a schematic view of a further arrangement for curing of a layer to which particles have been added, according to embodiments described herein.

As is illustrated in FIGS. 1C and 1D, the polymer layer 120 may be cured using various methods. As is illustrated in FIG. 1C, the substrate 110 can be introduced into an apparatus with the polymer layer 120 and with the semiconductor chip to be connected (not illustrated), in which case the apparatus can produce a magnetic alternating field. The field generation is represented by a coil 151 in FIG. 1C. If the material of the particles 130 is a ferromagnetic material, an external alternating magnetic field causes magnetization-reversal processes within the particles. This results in moving around the hysteresis curve of the ferromagnetic material, thus leading to heat dissipation, and heat development associated with this, within the curable or cured layer.

According to a further embodiment, as the magnetization frequency increases, this can result in phase shifts and, in consequence, in enlargement of the hysteresis. This occurs, for example, in a frequency range from 1 to 10 MHz. The desired heating effect which occurs as a result of the heat dissipation within the particles can be increased by enlarging the hysteresis.

The heating of the particles 130 which are contained in the polymer layer 120 results in heating and thus in curing of the polymer layer. Since the particles which generate the thermal energy are arranged locally in the polymer layer 120, local heating can be achieved during the production of semiconductor products.

According to a further embodiment, heat dissipation from the particles 130 can be achieved by introducing ferrimagnetic or paramagnetic particles into a varying magnetic field, using a frequency (for example in the range from a few kilohertz to 10 MHz or up to 10 GHz) such that the ferrimagnetic or paramagnetic particles cannot follow the magnetization reversal. According to yet another embodiment, this effect can be increased by the particles having low specific conductivity. This results in the varying magnetic field generating eddy currents, which lead to additional power dissipation.

According to a further embodiment, which is illustrated in FIG. 1D, energy is dissipated in the polymer layer 120 with the particles 130 contained in it by means of a combination of microwave radiation and a constant magnetic field. The substrate 110 is shown with the polymer layer 120 in FIG. 1D. The poles 152 and 153 for application of a magnetic field, which may be kept constant over time for the curing process, are located, in FIG. 1D, above and below the substrate 110. The microwave radiation 154 is passed to the semiconductor module. The microwave radiation in conjunction with the magnetic field leads to ferromagnetic resonance for magnetic particles (for example ferromagnetic, ferrimagnetic or paramagnetic (super paramagnetic) materials). The magnetic field and the parallel microwave radiation force the particles to carry out a gyroscopic movement, which leads to local heating.

Frequencies from 1 to 300 GHz can typically be used for the microwave field. A typical field strength, as used for specific embodiments, of the constant magnetic field may be 50 µT.

According to typical embodiments described herein, curable or cured layers are used in the construction and connection technology for semiconductor products and semiconductors modules. By way of example, these may be polymer layers. Typical examples for the layer according to various embodiments may be chip adhesives for connection of a semiconductor chip to a substrate. In this case, according to yet further different embodiments, metal leadframe, metallized ceramic or organic printed circuit boards may be used as substrates.

According to further embodiments, encapsulation materials may be used, such as plastic-sprayed semiconductor housings or enveloping materials in general. Examples of these are encapsulation compounds (for example silicone), molding compounds (for example epoxy resin), globetop or gel. These encapsulation materials for semiconductor chips may be used for protection against particles, or for corrosion protection.

According to even more embodiments, a layer can be used as underfill material for so-called flipchip bonding. In this case as well, polymer layers are used in order to ensure the necessary reliability of the semiconductor products.

According to further typical embodiments, the layers to which particles have been added may be used for chip adhesive, molding compounds or the like, for example epoxy thermosetting plastic, silicone or thermoplastics. For example, according to various embodiments, material on an epoxy or polyimide base may be used as chip adhesive, with nanoparticles being added to this material.

According to embodiments described herein, the layers (for example polymer materials) are filled with magnetic or (highly) resistive particles which are caused to move and are heated by an external electromagnetic alternating field. Inter alia, this makes it possible to protect adjacent component parts, such as organic substrates, against external heat influences, for example in an oven, by local heating of the layers. This also results in the possibility of using materials which require an increased temperature briefly, as the layer.

In order to achieve thorough curing of the curable or cured layers (polymer materials) during the processing during production of semiconductor products, thorough curing of the layer is desirable. In the case of large-volume layers, inadequate curing can occur in the center of the layer when using external heat influences for thermal curing. In contrast to this, in the case of layers to which particles have been added, it is possible to achieve curing of the layers distributed within the volume and/or distributed uniformly over the volume.

Furthermore, the layers to which particles have been added offer a capability for local heating, by using the particles which dissipate heat at only specific points in the semiconductor products. For example, the particles may be introduced only as globetop over the chip, but not in the adhesive or the molding compound. This allows the boundary surface to be specially locally heated once again after complete component assembly, by which means, for example, the adhesion characteristics on this boundary surface can be modified.

Furthermore, according to other embodiments, local stress dissipation can be achieved by subsequent local heating.

In addition, according to further embodiments described herein, it is possible to reduce the temperature to which the polymer layers are heated. In conventional thermal curing processes, mobility of the molecules and polymer chains is produced inter alia via a high temperature. The high temperature leads to an increased probability of reaction of the polymer chains, and thus of the curing. In contrast to this, when stimulated by electromagnetic alternating fields, not only movement with respect to the heat emitted by the thermal dissipation but also movement caused by the alternating field take place. This makes it possible to reduce the temperature required for some of the embodiments. In this case, the temperature may be in the range between 50° C. to 150° C., or else approximately 100° C. or less.

In consequence, according to even more embodiments, the use of materials can be extended for use in layers. This makes it possible, for example, to use high-performance materials which until now have been unsuitable for the semiconductor field owing to the excessively high process temperatures. Examples of this may be thermosetting plastics which form even denser lattice structures as a result of this method, thus allowing novel characteristic profiles with respect to their hardness, their TG range or the like.

According to the embodiments described herein, the curing parameters such as time, temperature etc. can be controlled by the energy that is introduced. The relationship between the energy consumption of the system P with the volume V and the strength of the applied electrical alternating field E, the circular frequency w for an electrical loss factor $\epsilon''_{\mathit{eff}}$, can be described as follows.

$$P=\omega\epsilon_o\epsilon''_{\mathit{eff}}E^2_{rms}V.$$

A radiation source for an electromagnetic alternating field, such as the microwave field with a superimposed constant magnetic field, can be installed in a production line in order to allow curing immediately after adhesive application.

According to typical embodiments, the particles 130 and the core 132 of the particles may be composed of materials which are ferromagnetic, ferrimagnetic, paramagnetic or superparamagnetic. Examples of this are $FE_2O_3$ or $Fe_3O_4$. Further examples of the materials which can be used for ferromagnetic resonance are compounds of the type $MeOFe_2O_3$, where Me is at least one element from the group comprising Mn, Co, Ni, Cu, Zn, Mg or Cd.

Independently of specific embodiments, the particles may have sizes in the range from 10 nm to 100 μm. According to further embodiments, this applies to coated and/or uncoated particles.

According to various embodiments, the particles 130 may, for example, be uncoated, with these being used primarily for enveloping materials, encapsulation compounds, molding compounds, globetop or gel etc. Furthermore, it is possible to coat the particles 130, as illustrated in FIG. 1B for the layers to which particles have been added with, in general, for example chip adhesive, encapsulation materials such as potting materials or molding materials. In this case, the particles 130 have a magnetically conductive core 132 and a coating 134.

According to one embodiment, the core can be coated with conductive metals such as gold, silver, copper, nickel or aluminum. This makes it possible to provide a conductive polymer layer, depending on the density of the particles within the matrix, that is to say the curable or cured layer.

According to a further embodiment, the curable or cured layer 120 which contains the particles 130 may have a particle content of 0.1 to 80% by weight, 0.5 to 40% by weight, or 1% by weight to 30% by weight.

According to a further embodiment, the core 132 can be sheathed with a ceramic or polymer coating 134 in order in this way to provide electrical insulation. This results in an electrically insulating polymer compound.

According to even more embodiments, the thermal conductivity can be matched to a predetermined value within a range from 1.5 W/m·K) (for example quartz) to 1000 W/m·K) (for example CVD diamond) for electrically insulating coating, by the choice of material for the coating. According to even more embodiments, the thermal conductivity can be matched to a predetermined value in a range from 70 W/m·K) (for example nickel) to 420 W/m·K) (for example silver) for electrically conductive coatings by the choice of material of the coating. Additionally or alternatively, it is possible to use the particles to provide a filler which governs the thermal expansion of the layer 120 containing the particles 130. In addition, however, an additional filling material, such as silicon oxide, can be introduced into the polymer layer in order to match the thermal expansion to the requirements of the semiconductor product.

With respect to the electrically conductive layers explained above, it is possible according to typical embodiments, such as those described here, to produce an isotropic material characteristic. According to other embodiments it is possible to produce an anisotropic electrical conductivity by alignment of the particles in an external magnetic field.

According to various embodiments, the nanoferritic nanoparticles may be coated either with (highly) conductive metals such as gold, silver or copper, or, if electrical conductivity is not desirable, the particles can be coated with ceramic or polymer materials.

Furthermore, the layers to which particles have been added offer the capability for reversible curing. This means that the adhesive bonds or envelopes can be released again. With certain materials, such as thermoplastics, this offers the capability to loosen the layers, in order for example retrospectively to relieve the mechanical stresses introduced by the assembly process. This can be achieved, for example, by renewed heating of the corresponding layers, after which they are cooled down slowly.

As described in the following detailed embodiments of semiconductor products, the layers to which particles have been added can be used for curing molding compounds of semiconductor housings, the curing of chip adhesives or for local curing of specific volumes of components, for mechanical stress reduction or in order to improve the adhesion between specific boundary surfaces.

According to a further embodiment, the layers which can be cured by electromagnetic fields make it possible to cure different materials in one process. This allows curing to take place on one placement machine, therefore also allowing complete placement in one or a small number of steps if required. According to even further embodiments, different curing steps can be carried out in a first step, a second step and if required further steps, for step modules.

According to further embodiments, the (curable) layer can be heated in a few seconds (for example 10 s or less), starting from the moment when the radiation source is switched on. There is no need for a heating-up and cooling-down phase for layers to which magnetically conductive particles have been added.

According to a number of embodiments described herein, polymer components in a semiconductor module are cured by the use of coated nanoferritic nanoparticles in a polymer matrix, which is cured with the aid of radiation in the microwave range. In this case, a constant magnetic field is applied in addition to the microwave radiation, in order to produce ferromagnetic resonance. Typical values for the constant magnetic field can be provided by a current density of more than 10 kA/m and a field strength of 50 μT or more.

Figure 2:
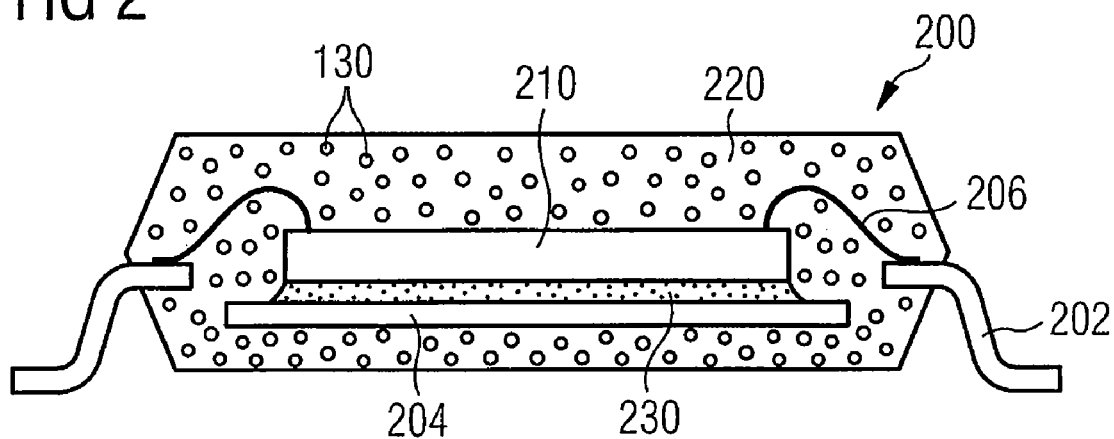
FIG. 2 shows a schematic view of a semiconductor product in order to illustrate exemplary embodiments with a layer to which particles have been added, according to embodiments described herein.

The semiconductor product 200 illustrated in FIG. 2 represents one application of the methods and principles explained with reference to FIGS. 1A to 1D. The semiconductor chip 210 is mounted on the substrate 204 by means of a chip adhesive layer 230.

By way of example, the semiconductor chip may be produced from a silicon wafer. In this case, the semiconductor chip according to one embodiment is produced from a thin ground wafer which has been split (dicing) into corresponding pieces.

The passive face of the semiconductor chip 210 is mounted on the substrate 204 by means of the chip adhesive 230. The bonded wires 206 guide the contacts on the active face of the semiconductor chip 210 to the leadframe 202. The semiconductor chip 210, the substrate 204, the wires 206 and parts of the leadframe are surrounded by the layer 220 in the form of an enveloping material. Particles 130 are distributed within the enveloping material. The enveloping material, which is used in order to encapsulate the semiconductor chip, is cured by one of the embodiments as described above, when a heat dissipation is produced in an electromagnetic field. The particles 130 which are distributed in the enveloping material, that is to say the layer 220, result in heating taking place for local curing in the layer 220. Furthermore, it is possible for the curing to take place in a uniformly distributed manner in the enveloping material.

According to one embodiment, the semiconductor product 200 may be provided, for example, in the form of a QFP (quad flat package) or a leadframe package. According to a further exemplary embodiment, the semiconductor chip may by a CMOS logic chip.

Typical advantages of the layers to which the particles as described above have been added, and on which at least one can be achieved entirely or partially, are curing with reduced thermal loading on the substrate or on adjacent components, accelerated curing by the lack of a heating-up phase, since particle mobility is produced directly, uniform curing, improved curing of zones which exhibit poor curing characteristics in a thermal curing process, the capability to use new materials, and the use of reversible curing, for example for thermoplastics.

The layer 220, which is in the form of an enveloping material in FIG. 2, is configured for the illustrated semiconductor product in such a manner, for example, that the enveloping material is electrically insulated. According to one embodiment, this can be achieved in that the particles 130 are surrounded by a ceramic or polymer, non-conductive, layer. According to another embodiment, this can be achieved by the use of electrically non-conductive particles.

The exemplary embodiments as described above of a semiconductor product 200 can, according to one embodiment, be produced by the following method. A wafer having a plurality of semiconductor chips 210 produced from it is ground to the desired thickness and the semiconductor chips produced on the wafer are then separated. The semiconductor chip is adhesively bonded to the substrate by a chip adhesive, for example by thermal curing. Furthermore, the wires 206 which, for example, may be produced from gold or aluminum, are connected to the semiconductor chip and to the leadframe 202 by bonding processes. According to one typical embodiment, the contacts of the leadframe 202 have not yet been bent as illustrated in FIG. 2 at this time.

According to one embodiment, an electrically insulating adhesive 230 is used for adhesive bonding of the chip 210 on the substrate 204.

The chip, the substrate and the other parts which are available within the layer 220 are surrounded by the liquid polymer material, which contains the particles 130. According to one embodiment, for example, this can be done in a mold.

According to one embodiment, the layer 220 can be heated by the application of an alternating magnetic field, thus resulting in curing. The distribution of the particles 130 in the layer 220 results in the curable or cured layer 220 being locally heated. Furthermore, according to a further embodiment, the heating and curing take place uniformly over the entire volume of the layer 220.

According to a further embodiment, the semiconductor product 200 as illustrated in FIG. 2 can also be cured by application of a constant magnetic field and irradiation with microwaves.

Furthermore, another embodiment of the semiconductor product 200 may include a layer which can be cured by an electromagnetic field, as the chip adhesive 230. For this purpose, magnetically conductive particles (ferromagnetic, ferrimagnetic or paramagnetic particles) are introduced into the chip adhesive 230, so that the curing of the chip adhesive for connection of the semiconductor chip 210 on the substrate 204 can also be carried out by means of an electromagnetic field.

Figure 3:
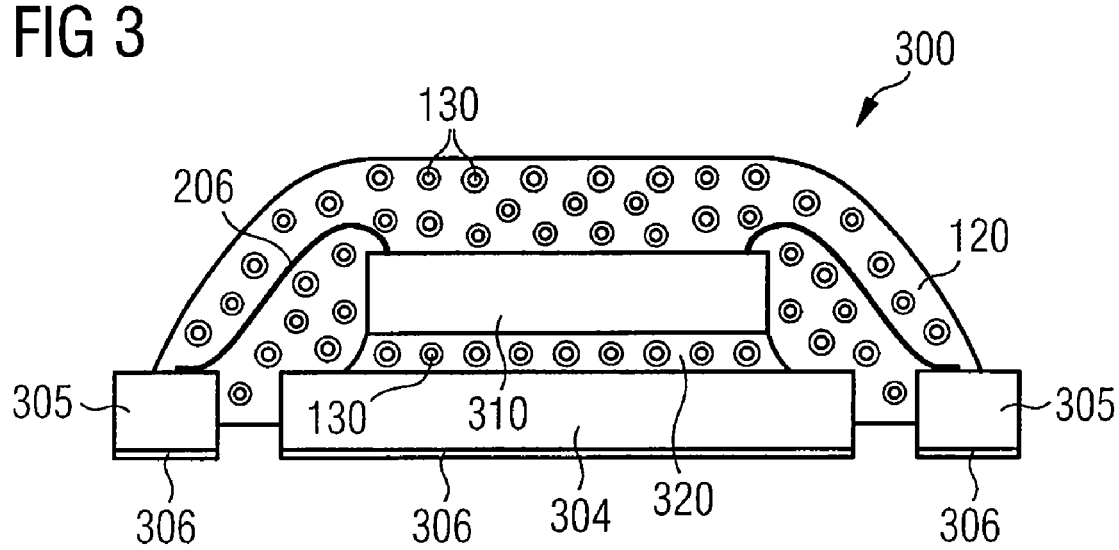
FIG. 3 shows a schematic view of a further semiconductor product in order to illustrate exemplary embodiments with at least one layer, to which particles have been added, as an enveloping material according to embodiments described herein.

A further embodiment of a semiconductor product 300 is illustrated in FIG. 3. According to one embodiment, this may be a leadless package, for example a QFN (quad flat non-leaded package). The semiconductor product 300 contains a semiconductor chip 310. According to one embodiment, the semiconductor chip 310 may be in the form of a transistor, for example a power transistor.

Power transistors are typically defined by the capability to switch heavy currents, high voltages or a high power. Typical values may be in the current range of 1 A, or power losses of more than 2 watts.

In the semiconductor product 300 shown in FIG. 3, the drain is arranged on the rear face (the lower face in FIG. 3), and the source and gate of the transistor are arranged on the upper face of the semiconductor chip. The leadframe of the semiconductor product 300 contains the perimeter contacts (perimeter lands) 305, and, in the central part of the leadframe 304, on which the semiconductor chip is fitted. The drain contact, which is arranged on the lower face of the semiconductor chip makes contact with the leadframe via an electrically conductive chip adhesive in the form of a layer 320 which can be cured by an electromagnetic field. The layer 320 for adhesive bonding of the semiconductor chip 310 to the leadframe 304 contains particles 130. In order to provide the desired electrical conductivity for the layer 320, the particles 130 are coated with an electrically conductive coating. According to various embodiments, this may, for example, be gold, silver, nickel, copper, or aluminum.

According to one of the curing methods described above, the layer 320 is cured by means of an electromagnetic field.

The source and gate contacts of the transistor are connected to the perimeter lands 305 by means of wires 206 composed, for example, of gold or aluminum. The leadframe which, according to a further embodiment, may for example be produced from copper, is coated with contact pads 306 on its lower face. According to one specific embodiment, these may be produced, for example, from tin (Sn) or tin/lead (SnPb).

As illustrated in FIG. 3, the semiconductor chip 310, parts of the leadframe 304, 305 and the wires 206 are encapsulated with an enveloping material in the form of a layer 120. The enveloping material 120 contains magnetically conductive particles 130, so that the envelope can be cured by means of an electromagnetic field according to one of the methods described above.

Figure 4A:
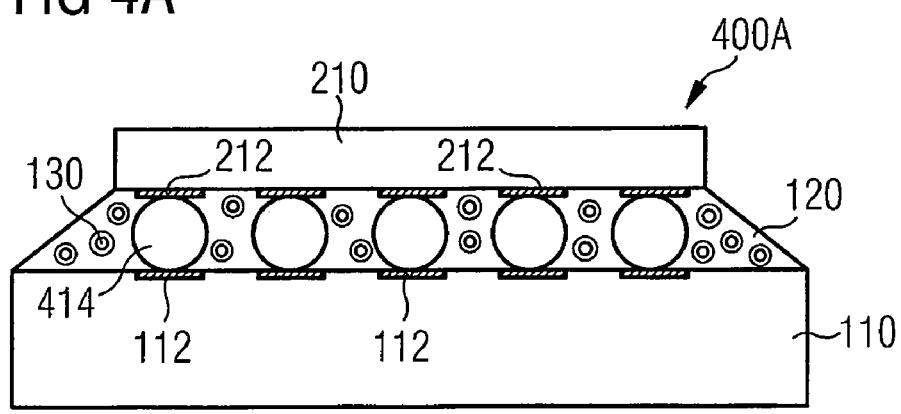
FIG. 4A shows a schematic view of yet another semiconductor product, which is flipchip-bonded in order to illustrate exemplary embodiments with an underfill layer, to which particles have been added, according to embodiments described herein.

A further embodiment of the semiconductor product is illustrated in FIG. 4A. The semiconductor product 400A contains a chip 210. The active face of the semiconductor chip 210 faces downward in FIG. 4A, facing the substrate, and the passive face on the semiconductor chip 210 in FIG. 4A is arranged on the side facing away from the substrate 110. The semiconductor chip 210 of the semiconductor product 400A is therefore flipchip-bonded in FIG. 4A.

According to one exemplary embodiment, the semiconductor chip may be a CMOS logic chip. According to a further embodiment, the semiconductor product may be a laminated package.

Electrical contacts 212 are arranged on the semiconductor chip 210. Furthermore, electrical contacts 112 are located on the substrate 110. The electrical contacts 212 of the semiconductor chip 210 and the electrical contacts 112 of the substrate are located opposite one another. According to one embodiment, they make contact with one another by means of solder balls 414.

This form of contact can result in stresses resulting from thermal expansion during operation. In this case, by way of example, the thermal expansion of the substrate differs from that of the semiconductor chip. As an alternative to this, or in addition to it, curvature of the substrate 110 can occur as a result of the influence of the heat which occurs during operation. According to one embodiment, this can occur in particular when the chip 210 is a power semiconductor with a large amount of heating.

In order to make it possible to reduce the forces which act on the solder balls 414 in the event of thermal expansion, as illustrated in FIG. 4A, an underfill material is provided, according to one embodiment, in the form of the curable or cured layer 120.

The underfill material in the form of a layer 120 contains the coated particles 130. The layer 120 can, for example, entirely or partially absorb the forces in the event of thermal expansion.

According to this embodiment, the particles 130 are coated with an insulating material. In this case, according to different embodiments, the coating may be composed of a ceramic or a polymer material. According to even further embodiments, the coating on the particles 130 is chosen in such a manner that the thermal expansion of the layer 120 is set such that it is between the thermal expansion of the substrate 110 and the thermal expansion of the semiconductor chip 210. This makes it possible for the underfill material to better absorb the forces which occur as a result of thermal expansion during operation.

Figure 4B:
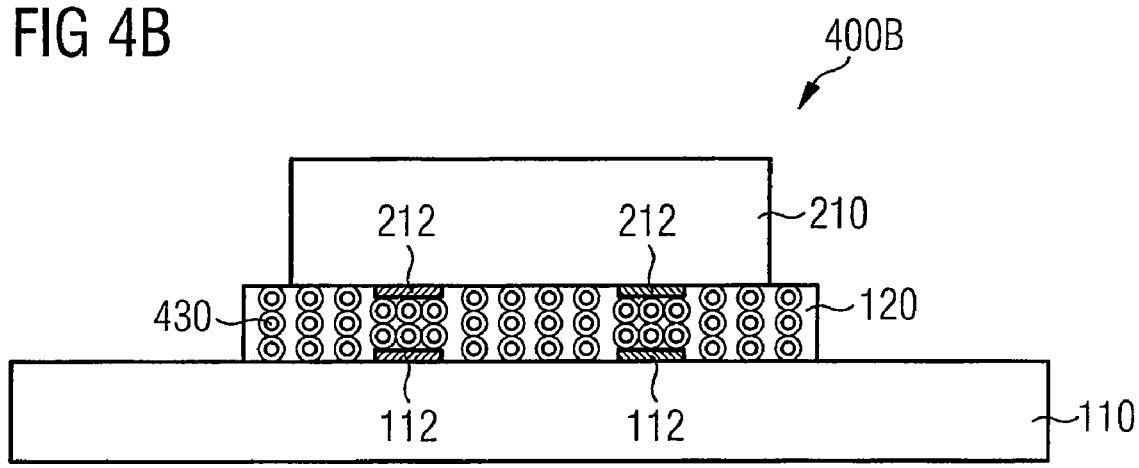
FIG. 4B shows a schematic view of a semiconductor product which is likewise flipchip-bonded, in order to illustrate exemplary embodiments with an underfill layer, to which particles have been added, according to embodiments described herein.

According to a further embodiment, and in a similar way to the embodiments, which have been described with reference to the semiconductor product 400A, the semiconductor chip 210 in the semiconductor product 400B illustrated in FIG. 4B is flipchip-bonded. In this case, the active side of the semiconductor chip 210 faces the substrate 110. The electrical contacts 212 on the semiconductor chip 210 are arranged on the active side of the semiconductor chip. The substrate 110 likewise has electrical contacts 112. The electrical contacts between the semiconductor chip 210 and the substrate 110 are provided by the layer 120 in the semiconductor product 400B. In this case, the particles 430 are provided in a polymer matrix, and are aligned by an external magnetic field during the curing of the curable layer 120. The electrically conductive particles 430 which, according to one embodiment, have a conductive coating composed of a conductive material, for example gold, silver, copper, nickel or aluminum, are aligned in the external magnetic field during the curing process such that anisotropic electrical conductivity is produced in the layer.

This results in electrical conductivity between an electrical contact 212 on the semiconductor chip and in each case one corresponding electrical contact on the substrate. However, there is no electrical conduction to an adjacent contact, because of the anisotropic characteristic of the layer. According to one embodiment, ferromagnetic particles can be used for this purpose. One example of this is nickel.

Figure 5:
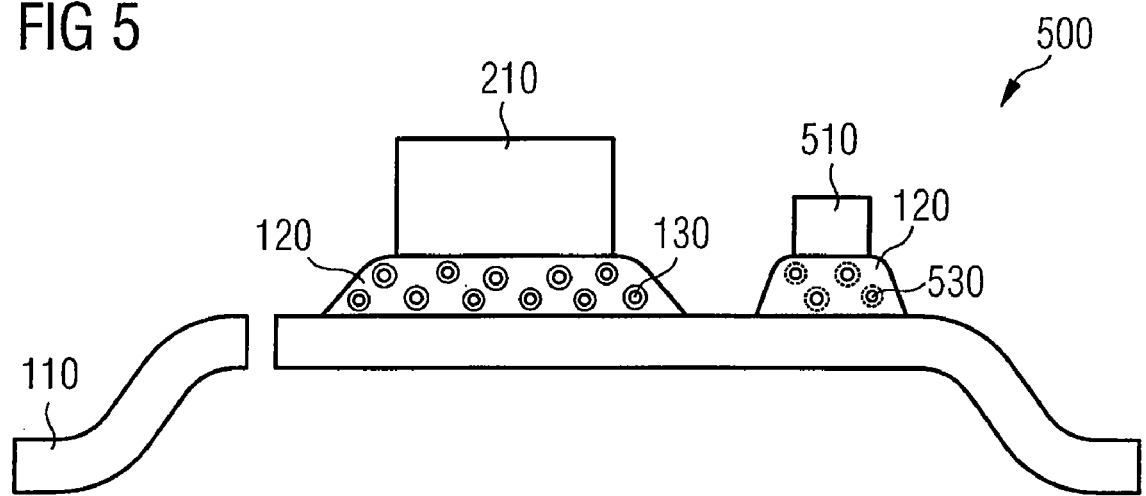
FIG. 5 shows a schematic view of a semiconductor product in order to illustrate exemplary embodiments with a layer to which particles have been added, and two semiconductor chips according to embodiments described herein.

FIG. 5 illustrates a further embodiment of a semiconductor product 500. A semiconductor chip 210, for example a power semiconductor, and a monitoring or control chip 510 (IC chip) are arranged alongside one another on a leadframe as the substrate 110. In this case, according to one embodiment, the layer 120 by means of which the power semiconductor chip 210 is mounted on the leadframe, may be formed by a conductive layer 120. According to one embodiment, this can be achieved by means of one of the coatings, as mentioned above, of the particles 130 with an electrically conductive material. According to another embodiment, the particles 130 may be formed from an electrically conductive ferromagnetic, ferrimagnetic or paramagnetic material.

The IC chip 510 is mounted on the substrate 110 by means of an electrically insulating curable or cured polymer material 120. As illustrated in FIG. 5 by the dashed line around the particles 530, an electrically insulating layer 120 can be provided by an electrically insulating coating on the particles 530, for example with a ceramic layer or a polymer layer.

According to this embodiment, the semiconductor chip 210 can make electrical contact with a part of the leadframe. Furthermore, the IC chip is arranged on the same leadframe, and is electrically isolated from it. Further contact from the upper face of the semiconductor chip 210 and/or of the IC chip 510, as well as an encapsulation material, are not illustrated in FIG. 5, for the sake of simplicity. However, corresponding embodiments can be obtained by combination with the corresponding features of other embodiments described here.

Figure 6:
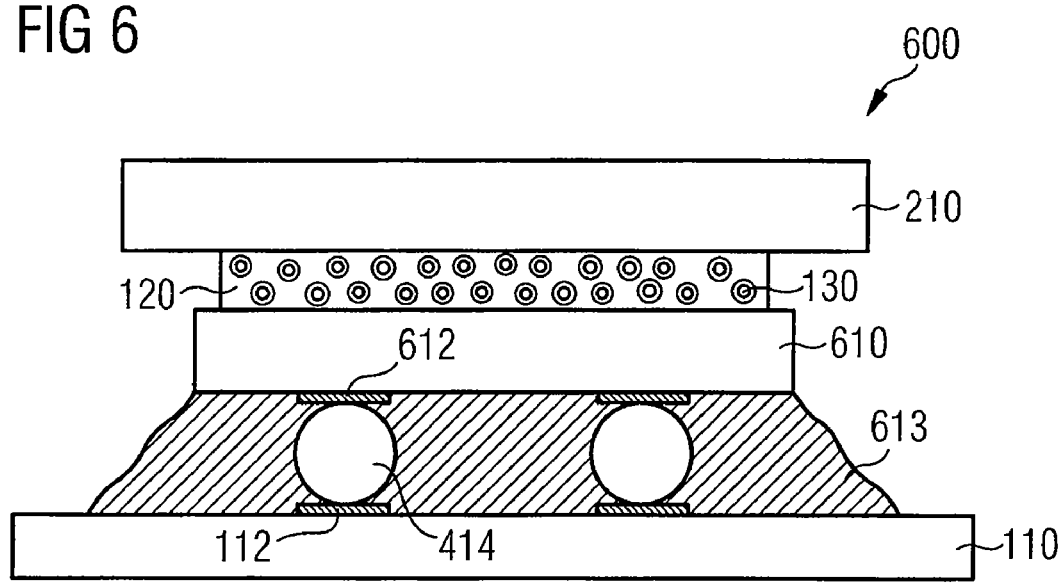
FIG. 6 shows a schematic view of a stack module in order to illustrate exemplary embodiments with a layer to which particles have been added, according to embodiments described herein.

Further embodiments of semiconductor products 600 will now be described with reference to FIG. 6. According to these embodiments, the semiconductor product 600 contains a substrate 110 with contacts 112. A first semiconductor chip 610 with contacts 612 is bonded on the substrate flipchip. According to one embodiment, a contact is provided between the contact pads 612 and the contact pads 112 by means of solder balls 414. As explained above, an underfill material 613 is used in order to reduce the forces acting on the solder balls 414 as a result of thermal expansion. According to one embodiment, the underfill material 613 is thermally cured. According to another embodiment, the flipchip-bonded semiconductor chip 610 can also be produced by one of the embodiments which have been explained with reference to FIGS. 4A and 4B.

A further semiconductor chip 210 is provided on the semiconductor chip 610 via a chip adhesive composed of a curable or cured layer 120, so as to provide a semiconductor stack. As illustrated in FIG. 6, particles 130 are distributed in the layer 120. This allows curing to be carried out by means of an electromagnetic field, according to one of the embodiments described above.

In order to produce a semiconductor stack, the layer 120 is typically provided as insulation between the semiconductor chip 610 and the semiconductor chip 210. This can be achieved, for example, by means of an electrically insulating coating on the particles 130, or in one of the other ways described above.

According to further embodiments, a further substrate intermediate layer can be introduced between the semiconductor chip 610 and the semiconductor chip 210. In this case, it is possible to provide the connection between the semiconductor chip 610 and the intermediate substrate, and between the intermediate substrate and the semiconductor chip 210, by means of one electromagnetically curable layer 120 in each case.

Figure 7:
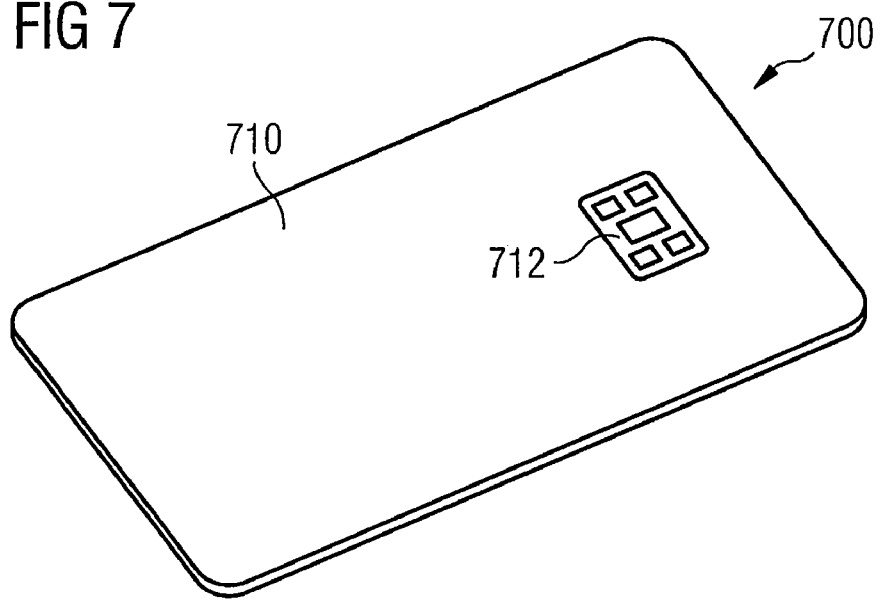
FIG. 7 shows a schematic view of a semiconductor product in order to illustrate exemplary embodiments with a layer to which particles have been added, and a smart card substrate according to embodiments described herein.

A further embodiment for the layer which can be cured by electromagnetic fields, as described above, between a substrate and a semiconductor chip is provided in FIG. 7. The semiconductor product 700 represents a card, such as an IC card, credit card or a telephone card (for example a SIM card). In this case, the substrate 710 is a thin card to which a semiconductor chip 712 is applied.

Short curing times for the application of the semiconductor chip 712 to the substrate 710 are advantageous during production of semiconductor products such as these. A layer in which ferromagnetic, ferrimagnetic or paramagnetic particles are provided makes it possible to cure the connection between the semiconductor chip 712 and the card substrate 710 in a very short time.

According to typical embodiments, curing can be carried out in the range from one second to 30 seconds. According to one embodiment, a thin layer with particles contained in it is provided for this purpose with a thickness of between 10 μm and 50 μm. The heat dissipation which occurs effectively directly in the layer itself as a result of application of an electromagnetic field allows the curing process to be carried out very quickly, during the course of mass production.

As explained with reference to the semiconductor products 700 a production process for a semiconductor product can be carried out quickly and thus cost-efficiently, using layers which can be cured by means of electromagnetic fields. The following aspects may be considered in this case. Because of the locally produced heat dissipation from the electromagnetic stimuli applied to the particles in the layer, adjacent elements are not primarily heated. In consequence, those areas of the layer from which curing is desired are cured directly. The curing process effectively starts immediately when the radiation source is switched on. There is no need for any heating-up and cooling-down phase when using layers to which magnetically conductive particles have been added. Furthermore, there are no heating processes throughout the entire semiconductor product, which can lead to the heat that is introduced for the thermal curing process initially not being available to the desired layer.

Figure 8:
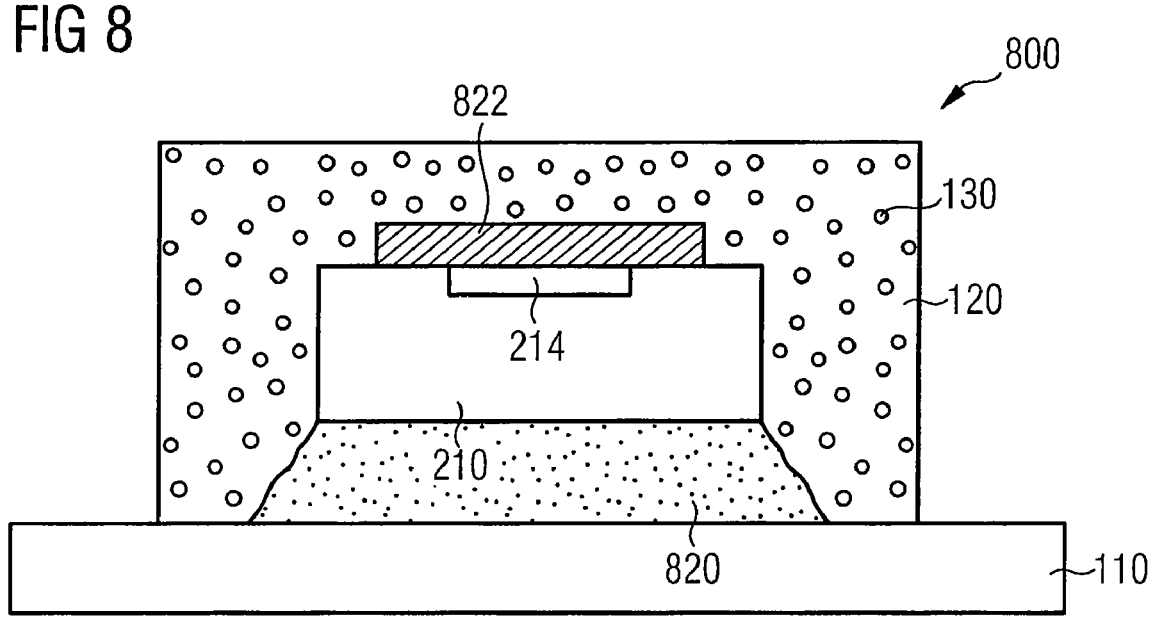
FIG. 8 shows a schematic view of a sensor semiconductor product in order to illustrate exemplary embodiments with a layer to which particles have been added, according to embodiments described herein.

FIG. 8 shows a further semiconductor product 800. The semiconductor product 800 represents a sensor semiconductor product and may, for example, be a pressure sensor. The semiconductor chip 210 is mounted on the substrate 110 via the thermally curable adhesive layer 820. The sensor area 214 is located on the side of the semiconductor chip 210 (the active side) facing away from the substrate. By way of example, for a pressure sensor, this may be the area which reacts to the pressure. In order to avoid producing a major offset in the pressure measurement as a result of stresses in the materials being produced during production in this case, a first layer 822 is provided over the sensor area 214. According to one embodiment, by way of example, this first layer 822 may be a silicone layer with relatively high elasticity. This silicone layer can be thermally cured according to one embodiment, and in this case protects the sensor area 214 against stresses.

The semiconductor chip is cured, with an encapsulation material, by means of the layer 120. Particles 130 are provided within the layer 120. The layer 120 can be cured by the particles 130, by means of electromagnetic fields, according to one of the methods described above.

As can be explained using the example of a pressure sensor, stresses in the encapsulation material or molding material lead to undesirable sensor characteristics. According to one embodiment, it is therefore possible for the layer 120 together with the particles contained in it to be heated again and cooled down deliberately, by means of a process based on an electromagnetic field. Stresses in the encapsulation material can therefore be deliberately reduced by the capability for local and deliberate heating and cooling of the enveloping layer.

According to a further embodiment, it is also possible to add ferromagnetic, ferrimagnetic or paramagnetic particles to the elastic protective layer 822 in order to deliberately heat these layers and thus to reduce stresses in the sensor area 212.

Independently of the various embodiments, the layers described above, to which particles (ferromagnetic, ferrimagnetic, paramagnetic or super paramagnetic particles) are added, can also be deliberately heated a second time, by means of heat dissipation, after the actual curing process. This allows stressing in the respective chip adhesive layers, underfill layers, intermediate layer or enveloping materials to be reduced, or cracks to be healed, by renewed heating of the material.

While the above description has been directed at embodiments, other embodiments can be derived from these without departing from the scope of the invention as specified by the claims.

What is claimed is:

1. A semiconductor product, comprising:
   a substrate;
   a semiconductor chip fitted to the substrate; and
   a layer, which contains coated particles, located adjacent to the semiconductor chip,
   wherein the coated particles have a ferromagnetic, ferrimagnetic or paramagnetic core and a coating.

2. The semiconductor product as claimed in claim 1, wherein the layer contains an enveloping layer for encapsulating the semiconductor chip.

3. A semiconductor product, comprising:
   a substrate;
   a semiconductor chip fitted to the substrate; and
   an encapsulation layer, which is located adjacent to the semiconductor chip, configured to encapsulate the semiconductor chip,
   wherein the encapsulation layer contains coated particles having a ferromagnetic, ferrimagnetic or paramagnetic core and a coating.

4. The semiconductor product as claimed in claim 1, wherein the layer is a polymer layer.

5. The semiconductor product as claimed in claim 1, wherein a characteristic of the layer is matched by the coating being at least one characteristic from the group consisting of electrical conductivity, thermal conductivity and thermal coefficients of expansion.

6. The semiconductor product as claimed in claim 1, wherein the coating is composed of material selected from the group consisting of Au, Ag, Cu, Ni and Al.

7. The semiconductor product as claimed in claim 1, wherein the coating is a ceramic or a polymer material.

8. The semiconductor product as claimed in claim 1, wherein the layer forms a chip adhesive or an enveloping material for a semiconductor chip.

9. The semiconductor product as claimed in claim 1, wherein the layer is electrically conductive.

10. The semiconductor product as claimed in claim 5, wherein the layer is anisotropically electrically conductive.

11. The semiconductor product as claimed in claim 1, wherein the mean diameter of the particles is in a range from 2 nm to 120 μm.

12. The semiconductor product as claimed in claim 1, further comprising a filler configured to match the thermal expansion of the layer to the thermal expansion of the semiconductor chip.

13. The semiconductor product as claimed in claim 1, further comprising:
   a further semiconductor chip in order to form a stack composed of at least two semiconductor chips; and
   a further layer, which is cured by thermal radiation, being provided adjacent to the further semiconductor chip.

14. The semiconductor product as claimed in claim 1, further comprising:
   a further semiconductor chip; and
   a further layer adjacent to the further semiconductor chip, wherein the semiconductor chip and the further semiconductor chip are mounted on the substrate by means of the layer or the further layer, the layer is conductive, and the further layer is non-conductive.

15. The semiconductor product as claimed in claim 1, wherein the substrate is a smart card substrate, and the semiconductor chip is mounted on the smart card substrate by means of the layer.

16. The semiconductor product as claimed in claim 1, wherein the semiconductor chip is a power semiconductor chip.

17. A semiconductor product, comprising:
   a substrate;
   a semiconductor chip; and
   a curable layer means, which contains coated particles, for mounting the semiconductor chip on the substrate,
   wherein the coated particles have a ferromagnetic, ferrimagnetic or paramagnetic core and a coating.

* * * * *